US012703640B2

(12) United States Patent
Ma et al.

(10) Patent No.: US 12,703,640 B2
(45) Date of Patent: Aug. 11, 2026

(54) METHOD FOR PRODUCING HIGH-PURITY CESIUM HALIDE, AND PEROVSKITE COMPOSITE MATERIAL

(71) Applicant: Hanwha Solutions Corporation, Seoul (KR)

(72) Inventors: Kyung Yeon Ma, Seoul (KR); Song Hee Kim, Yongin-si (KR); Gwang Su Shin, Ansan-si (KR)

(73) Assignee: HANWHA SOLUTIONS CORPORATION, Seoul (KR)

( * ) Notice: Subject to any disclaimer, the term of this patent is extended or adjusted under 35 U.S.C. 154(b) by 0 days.

(21) Appl. No.: 18/997,854

(22) PCT Filed: Feb. 3, 2023

(86) PCT No.: PCT/KR2023/001609
§ 371 (c)(1),
(2) Date: Jan. 23, 2025

(87) PCT Pub. No.: WO2023/167441
PCT Pub. Date: Sep. 7, 2023

(65) Prior Publication Data

US 2025/0214855 A1 Jul. 3, 2025

(30) Foreign Application Priority Data

Mar. 2, 2022 (KR) ........................ 10-2022-0026844

(51) Int. Cl.

| | |
|---|---|
| ***C01D 17/00*** | (2006.01) |
| ***C01G 21/00*** | (2006.01) |
| ***H10K 85/50*** | (2023.01) |
| *H10K 30/10* | (2023.01) |
| *H10K 30/50* | (2023.01) |

(52) U.S. Cl.
CPC ......... *C01D 17/003* (2013.01); *C01G 21/006* (2013.01); *H10K 85/50* (2023.02); *C01P 2002/34* (2013.01); *C01P 2006/40* (2013.01); *C01P 2006/60* (2013.01); *C01P 2006/80* (2013.01); *H10K 30/10* (2023.02); *H10K 30/50* (2023.02)

(58) Field of Classification Search
CPC ............. C01D 17/00; C03G 1/06; H01B 1/06
See application file for complete search history.

(56) References Cited

U.S. PATENT DOCUMENTS 10,941,165 B2 * 3/2021 Luther ...................... C07F 7/24
11,967,227 B1 * 4/2024 Tiwari .................. B60Q 5/005
(Continued)

FOREIGN PATENT DOCUMENTS

CN 110616461 A 12/2019
CN 104108732 * 10/2021
JP 2016-152296 A 8/2016

OTHER PUBLICATIONS

English language machine translation of CN-118324167-A (pub Jul. 2024).*
(Continued)

*Primary Examiner* — Mark Kopec
(74) *Attorney, Agent, or Firm* — Sughrue Mion, PLLC

(57) ABSTRACT

The present invention relates to a method for producing a cesium halide, and more particularly, to a novel method for producing a cesium halide with high purity; and perovskites produced using same.

5 Claims, 1 Drawing Sheet

(56) References Cited

U.S. PATENT DOCUMENTS

| | | | |
|---|---|---|---|
| 2020/0144438 | A1 | 5/2020 | Wang et al. |
| 2020/0248070 | A1 | 8/2020 | Bao et al. |

OTHER PUBLICATIONS

Chun Kiu Ng, et al., "Synthetic Evolution of Colloidal Metal Halide Perovskite Nanocrystals", Langmuir, American Chemical Society, 2019, pp. 11609-11628, vol. 35.
International Search Report for PCT/KR2023/001609 dated May 9, 2023 (PCT/ISA/210).
Written Opinion for PCT/KR2023/001609 dated May 9, 2023 (PCT/ISA/237).

* cited by examiner

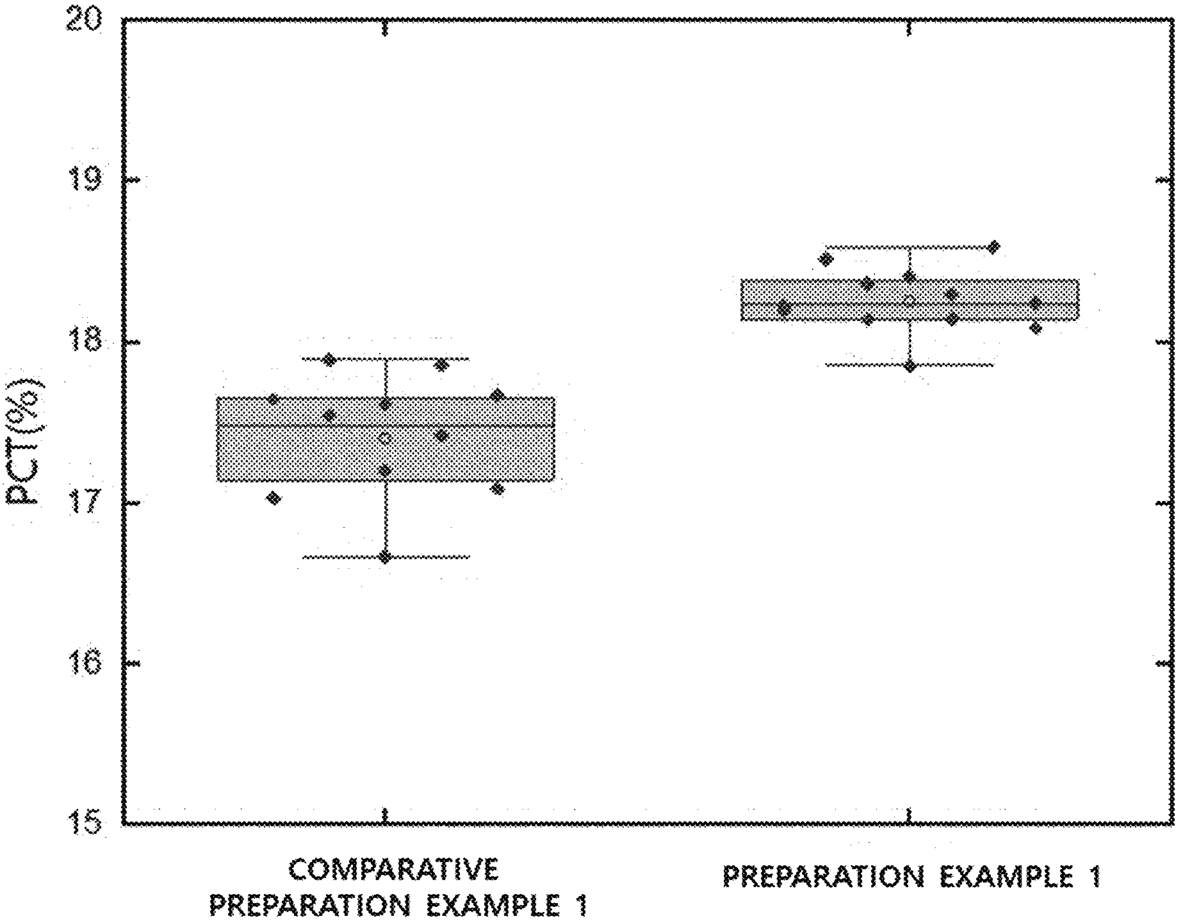
20
19
18
17
16
15
PCT(%)
COMPARATIVE PREPARATION EXAMPLE 1
PREPARATION EXAMPLE 1

METHOD FOR PRODUCING HIGH-PURITY CESIUM HALIDE, AND PEROVSKITE COMPOSITE MATERIAL

CROSS REFERENCE TO RELATED APPLICATIONS

This application is a National Stage of International Application No. PCT/KR2023/001609 filed Feb. 3, 2023, claiming priority based on Korean Patent Application No. 10-2022-0026844 filed Mar. 2, 2022.

TECHNICAL FIELD

The present invention relates to a method of producing a cesium halide (CsX) purified with high purity using a solubility difference, and a perovskite composite material produced using the same.

BACKGROUND ART

To solve the global environmental problems caused by the depletion of fossil fuels and their use, research on renewable and clean alternative energy sources such as solar energy, wind powder, and hydropower is actively being conducted.

Among these, interest in solar cels that directly covert sunlight into electrical energy is increasing significantly. Here, a solar cell is a cell that generates current-voltage by using the photovoltaic effect generating electrons and holes by absorbing light energy from sunlight.

Currently, it is possible to manufacture n-p diode-type silicon (Si) single crystal-based solar cells with a photoelectric conversion efficiency of more than 20%, and these cells are being used for actual solar power generation. There are also solar cells using compound semiconductors such as gallium arsenide (GaAs) with better conversion efficiency. However, since these inorganic semiconductor-based solar cells require a highly purified material to achieve high efficiency, much energy is consumed in purifying raw materials, and expensive process equipment is required in the process of forming single crystals or a thin film using the raw materials, limiting the reduction in the manufacturing cost of solar cells, which has been an obstacle to large-scale use.

Accordingly, in order to manufacture solar cells at a low cost, it is necessary to drastically reduce the cost of materials used as core elements in solar cells or producing processes, and research is being conducted on perovskite solar cells that can be produced with low-cost materials and processes as an alternative to inorganic semiconductor-based solar cells.

The general structural formula of the perovskite structure is the $ABX_3$ structure, where an anion is located at the X site, a large cation is located at the A site, and a small cation is located at the B site.

As an inorganic metal halogenated material, perovskites having a $CsPbX_3$ (X=Cl, Br, or I) structure have a wide spectrum of approximately 410 to 700 nm, and the advantage of being able to absorb the entire range of visible light and exhibit various fluorescence colors by adjusting constituent elements. In addition, above all, they can exhibit a high-purity fluorescence color through a narrow half-width (approximately 10 to 40 nm) and uniform particle size distribution (approximately 4 to 15 nm), and have a quantum yield (QY) of at least 50% to at most 90% and show an excellent fluorescence characteristic especially in the blue (B) and green (G) spectrum ranges. Therefore, the perovskite according to the present invention is very promising in a variety of optoelectronic devices such as lasers, displays, solar cells, and optical sensors.

As a Cs-and-X precursor used for the preparation of perovskites having a $CsPbX_3$ (X=Cl, Br, or I) structure, CsX (X=Cl, Br, or I) is used, which is the reaction product of $Cs_2CO_3$ and a hydrogen halide (HX; X=Cl, Br, or I) as shown in Reaction Scheme 1. To remove the reaction solvent and another reaction product, water ($H_2O$), the CsX was then subjected to a high-temperature heating process, which has the problems of increasing the unit cost and reducing the yield when mass-producing CsX. In this case, when water is boiled and evaporated, unpurified residual reactants ($Cs_2CO_3$ and HX) may remain, and there may be a problem that satisfactory high-purity CsX cannot be obtained due to impurities being mixed therein depending on the conditions of the high-temperature heating process.

$$Cs_2CO_3(aq)+2HX(aq)\rightarrow 2CsX(aq)+CO_2(g)\uparrow H_2O\rightarrow (H_2O\ evaporation)\rightarrow CsX \quad \text{[Reaction Scheme 1]}$$

In Reaction Scheme 1, X is Cl, Br, or I.

Recently, new technologies using perovskites have been developed in various technological fields such as solar cells, displays, lasers, and sensors, and the demand for $CsPbX_3$ is expected to continuously increase. Therefore, a new method for synthesizing CsX with a high yield and high purity while lowering the production cost of CsX, which is a precursor used in the production of $CsPbX_3$, is urgently needed.

DISCLOSURE

Technical Problem

To overcome the above-described problems, the present invention is directed to providing a cesium halide (CsX) synthesis method that introduces a process of purifying CsX with high purity without reducing the yield during CsX purification, rather than a conventional process such as a high-temperature heating process during CsX production, and a perovskite produced using the CsX synthesized by the above-mentioned method.

Technical Solution

One aspect of the present invention provides a method of synthesizing a CsX, which includes preparing an aqueous $Cs_2CO_3$ solution (Step 1); adding an aqueous hydrogen halide (HX) solution dropwise to the aqueous $Cs_2CO_3$ solution while stirring to allow a reaction (Step 2); preparing a mixture by inputting and washing the reaction solution obtained in Step 2 in a washing solvent (Step 3); and obtaining a CsX powder by filtering and drying the mixed solution of Step 3 (Step 4).

According to an exemplary embodiment of the present invention, the aqueous $Cs_2CO_3$ solution of Step 1 may include 40 to 50 wt % of $Cs_2CO_3$ and the remainder of water.

According to an exemplary embodiment of the present invention, the aqueous HX solution of Step 2 may include 46 to 50 wt % of a hydrogen halide and the remainder of water.

According to an exemplary embodiment of the present invention, the dropwise addition in Step 2 may be carried out so that the aqueous $Cs_2CO_3$ solution and the aqueous HX solution are mixed in a volume ratio of 1:0.87 to 1.

According to an exemplary embodiment of the present invention, the reaction in Step 2 may be performed at 20 to 40° C., and the stirring may be performed at 500 to 1500 rpm.

According to an exemplary embodiment of the present invention, the washing solvent in Step 3 may have a polarity of 4 to 6, a dipole moment of 1.60 to 4.00 (debye, D), and a dielectric constant of 13 to 37.

According to an exemplary embodiment of the present invention, the washing solvent in Step 3 may include one or more selected from acetone, methanol, ethyl alcohol, acetonitrile, tetrahydrofuran (THF), pyridine, methyl ethyl ketone (MEK), and methyl isobutyl ketone (MIBK).

According to an exemplary embodiment of the present invention, Step 3 may be performed at 4 to 10° C.

The mixed solution in Step 3 may include the reaction solution and the washing solvent in a volume ratio of 1:5 or more, and preferably, 1:5 to 20.

According to an exemplary embodiment of the present invention, the CsX powder obtained in Step 4 may have a yield of 83 to 99% and a purity of 97 to 99.9%.

Another aspect of the present invention provides a perovskite composite material using the CsX produced by the above-described method, which is represented by Chemical Formula 1 below.

$$Cs_aA_{(3-a)}MX_bX'_{(3-b)} \quad \text{[Chemical Formula 1]}$$

In Chemical Formula 1, A is a monovalent cation, such as an amine, ammonium, a Group 1 metal, a Group 2 metal, and/or another cation, or a cation-like compound, where M is a divalent cation, including one or two selected from Fe, Co, Ni, Cu, Sn, Pb, Bi, Ge, Ti, Eu, and Zr, X and X' are independently Cl, Br, or I (however, X and X' are halogen atoms different from each other), a is an integer such that $0<a\leq1$, and b is an integer such that $0<a\leq3$.

Still another aspect of the present invention provides a perovskite solar cell, which includes the perovskite composite material as a light absorbing layer (or light activating layer).

The present invention is a research product supported by the National Research and Development Project.

[National Research and Development Project Supporting the Invention]

[Serial No. of Task] 1415180454

[Grant Number] 20203040010320

[Name of Department] Ministry of Trade, Industry, and Energy

[Name of Project Management Agency] Korea Institute of Energy Technology Evaluation and Planning

[Title of Research Project] Development of New and Renewable Energy Core Technology (R& D)

[Title of Research Task] Development of technology to manufacture 6-inch perovskite/crystalline silicon tandem solar cell with efficiency of 26% for increasing the amount of power generation

[Contribution Rate] 1/1

[Name of Task Execution Organization] Hanwha Solutions Co., Ltd.

[Research Period] Oct. 1, 2020~Sep. 30, 2023

Advantageous Effects

According to the present invention, a cesium halide (CsX) can be produced with a high yield and high purity in an economical manner, a perovskite can be produced using the CsX of the present invention, and a solar cell with improved performance can be manufactured by applying the perovskite as a light absorbing layer.

DESCRIPTION OF DRAWINGS

The FIGURE is a graph showing the results of measuring the photoelectric conversion efficiency (PCE, %) of perovskite ($CsPbBr_3$) solar cells manufactured in Preparation Example 1 and Comparative Preparation Example 1.

MODES OF THE INVENTION

Hereinafter, the present invention will be described in further detail.

The present invention relates to a method of producing a cesium halide (CsX, where X is Cl, Br, or I), which is used in the production of a perovskite composite material, with a high yield and high purity.

The perovskite composite material is a perovskite composite material represented by Chemical Formula 1.

$$Cs_aA_{(3-a)}MX_bX'_{(3-b)} \quad \text{[Chemical Formula 1]}$$

In Chemical Formula 1, A is a monovalent cation, such as an amine, ammonium, a Group 1 metal, a Group 2 metal, and/or another cation, or a cation-like compound, and preferably, formamidinium (FA), methylammonium (MA), FAMA, or $N(R)_4^+$ (where R may be the same group or different groups, and R may be a C1 to C5 linear alkyl group, a C3 to C5 branched alkyl group, a phenyl group, an alkylphenyl group, an alkoxyphenyl group, or an alkyl halide).

In addition, in Chemical Formula 1, M may be a divalent cation, including one or two selected from Fe, Co, Ni, Cu, Sn, Pb, Bi, Ge, Ti, Eu, and Zr, preferably, one or two selected from Cu, Sn, and Pb, and more preferably, Pb.

In addition, in Chemical Formula 1, X and X' are independently Cl, Br, or I. However, X and X' are halogen atoms that are different from each other. In addition, a is an integer such that $0<a\leq1$, and b is an integer such that $0<a\leq3$.

In the present invention, CsX (where X is Cl, Br, or I) may be synthesized by preparing an aqueous $Cs_2CO_3$ solution (Step 1); adding an aqueous HX solution dropwise to the aqueous $Cs_2CO_3$ solution while stirring to allow a reaction (Step 2); preparing a mixture by inputting and washing the reaction solution obtained in Step 2 in a washing solvent (Step 3); and obtaining CsX powder by filtering and drying the mixed solution of Step 3 (Step 4).

The aqueous $Cs_2CO_3$ solution of Step 1 may include 40 to 50 wt % of $Cs_2CO_3$ and the remainder of water, preferably, 45 to 50 wt % of $Cs_2CO_3$ and the remainder of water, and more preferably, 48 to 50 wt % of $Cs_2CO_3$ and the remainder of water. Here, in the aqueous $Cs_2CO_3$ solution, when the content of $Cs_2CO_3$ is less than 40 wt %, the amount of CsX, which is the reaction product, is too small, and when the content of $Cs_2CO_3$ is more than 50 wt %, the purity of CsX obtained by unreacted $Cs_2CO_3$ is lowered. Therefore, it is preferable that the CsX be included within the above range.

In addition, the aqueous HX solution of Step 2 (where X is Cl, Br, or I) may include 46 to 50 wt % of HX (where X is Cl, Br, or I) and the remainder of water, preferably, 46.5 to 49.0 wt % of HX and the remainder of water, and more preferably, 47.0 to 48.0 wt % of HX and the remainder of water. Here, in the aqueous HX solution, when the content of HX is less than 46 wt %, the amount of CsX, which is the reaction product, is too small, and when the content of HX is more than 50 wt %, the purity of CsX obtained by unreacted HX may be lowered. Therefore, it is preferable that the CsX be included within the above range.

In addition, the dropwise addition and reaction in Step 2 may be performed at 20 to 40° C., preferably 30 to 40° C., and more preferably 35 to 37° C. Here, when this process is performed at less than 20° C., the reaction rate between $Cs_2CO_3$ and HX may be too slow, making the process in Step 2 too long and reducing the productivity of CsX. Since it is uneconomical to perform this process at a temperature exceeding 40° C., there is no further increase in CsX yield. Therefore, it is preferable to perform this process at the above temperature condition.

In addition, the dropwise addition and reaction in Step 2 may be performed under the stirring condition of 500 to 1500 rpm, preferably, 700 to 1,000 rpm, and more preferably, 700 to 800 rpm. Here, when the stirring rate is less than 500 rpm, the reaction ate between $Cs_2CO_3$ and HX is too slow, and the process of Step 2 takes too long, reducing the mass productivity of CsX, and when the reaction rate exceeds 1500 rpm, there may be difficulty in uniform stirring, so it is preferable to perform stirring under the above conditions.

In addition, it is appropriate to carry out the reaction in Step 2 for approximately 40 to 120 minutes, and preferably, approximately 40 to 90 minutes, under the above temperature and stirring conditions.

In addition, the dropwise addition of the aqueous HX solution in Step 2 may be performed to mix the aqueous $Cs_2CO_3$ solution and the aqueous HX solution in a volume ratio of 1:0.87 to 1.00, preferably, 1:0.87 to 0.95, and more preferably, 1:0.87 to 0.88 and react them. When the volume ratio is outside of the above range, the CsX yield may decrease, and the purity of CsX may be lowered due to the remaining unreacted materials, so it is preferable to mix and react them within a range satisfying the above volume ratio.

When the process of Step 2 is completed, by the reaction between $Cs_2CO_3$ and HX, the reaction products, such as CsX (aqueous), $CO_2$ and $H_2O$, are generated, and $CO_2$ is evaporated and removed from the reaction solution, leaving CsX (aqueous), $H_2O$, and unreacted residues in the reaction solution.

Subsequently, Step 3 is a process of solidifying and precipitating CsX dissolved in a reaction solution and separating and removing the unreacted residues from CsX. Here, the reaction solution which has undergone Step 2 is added to the washing solvent of 4 to 10° C., preferably, 4 to 8° C., and then the solidified CsX is precipitated.

In addition, after adding the reaction solution to the washing solvent, the washing reaction in Step 3 may be performed under a stirring condition of 800 to 1,500 rpm, preferably, 800 to 1,300 rpm, and more preferably, 800 to 1,000 rpm. Here, when the stirring rate is less than 800 rpm, the purity is reduced because the rate at which unreacted materials are washed is too slow, and when the reaction rate exceeds 1500 rpm, there may be difficulty in uniform stirring. Therefore, it is preferable to perform stirring under the above condition.

In addition, the reaction in Step 3 may be performed for approximately 40 to 120 minutes, and preferably, approximately 40 to 90 minutes under the temperature and stirring conditions.

Step 3 is a process of precipitating CsX using solubility caused by the polarity difference between the reaction product and unreacted materials in the reaction solution, and the washing solvent. Here, due to the low solubility in the washing solvent, CsX is precipitated, and the unreacted residues ($Cs_2CO_3$, HX, etc.) exhibit low solubility and thus are dissolved in the washing solvent.

The washing solvent is a polar solvent which mixes well with water, preferably satisfying a polarity of 4 to 6, a dipole moment of 1.6 to 4.0 (debye, D), and a dielectric constant of 13 to 37, preferably, a polarity of 4.2 to 5.7, a dipole moment of 1.6 to 3.5 (debye, D), and a dielectric constant of 13 to 28, more preferably, a polarity of 4.5 to 5.5, a dipole moment of 2.5 to 3 (debye, D), and a dielectric constant of 18.0 to 22.0. When the polarity, dipole moment, and/or dielectric constant are not satisfied, the yield and/or purity of CsX may decrease.

As a preferable example of a solvent from which a washing solvent satisfying the purity, dipole moment, and dielectric constant can be prepared, a washing solvent obtained by mixing one or two or more selected from acetone, methanol, ethyl alcohol, acetonitrile, tetrahydrofuran (THF), pyridine, methyl ethyl ketone (MEK), and methyl isobutyl ketone (MIBK), and preferably, one or two or more selected from acetone, methanol, and ethyl alcohol, may be used.

In addition, the mixing ratio of the washing solvent and the reaction solution in Step 3 may be 1:5 or more, preferably, 1:5 to 20, more preferably, 1:8 to 15, and even more preferably, 1:8 to 12.

Next, Step 4 is a process of separating and obtaining the CsX precipitated from Step 3 from the mixed solution, by a CsX powder can be obtained by filtering the mixed solution of Step 3 by a method generally used in the art and drying the filtering residue.

The yield and purity of the CsX (where X is Cl, Br, or I) prepared as described above may respectively be 83 to 99% and 97.0 to 99.9%, preferably, 85.0 to 99.0% and 98.0 to 99.9%, more preferably, 86.0 to 99.0% and 99.0 to 99.9%, and even more preferably, 90.0 to 99.0% and 99.0 to 99.9%.

A perovskite composite material having higher economic feasibility than that of the conventional perovskite composite material may be provided by synthesizing the perovskite composite material represented by Chemical Formula 1 using the CsX prepared in the above manner.

In addition, the perovskite composite material may be used in various technical fields, including solar cells, displays, and laser sensors.

As a preferable example, the perovskite composite material may be applied as a material for a light absorbing layer (or light activating layer) of a solar cell. Such a perovskite solar cell may be a p-i-n perovskite solar cell, an inverted perovskite solar cell, a tandem-type perovskite solar cell, or a tandem silicon/perovskite heterojunction solar cell.

As an exemplary embodiment of the perovskite solar cell, a solar cell, which includes a laminate having a structure in which a hole transport layer (HTL), a perovskite light absorbing layer, an electron transport layer (ETL), a passivation layer, and a source electrode are sequentially stacked, is provided.

In addition, when the solar cell of the present invention is an inverted perovskite solar cell, the laminate may be disposed on a drain electrode.

In addition, the inverted perovskite solar cell may be manufactured by forming a set consisting of a conductive substrate, a drain electrode, a hole transport layer, a light absorbing layer, an electron transport layer, and a source electrode in that order, and stacking the set in one or multiple layers.

As a still another exemplary embodiment, when the solar cell of the present invention is a tandem silicon/perovskite heterojunction solar cell, it may be manufactured by stacking a drain electrode, a silicon solar cell, a recombination layer, and the laminate sequentially.

The present invention will be described in detail by describing a method of forming the above-mentioned laminate constituting the perovskite solar cell of the present invention, and the laminate may be formed by a process including: forming an electron transport layer by coating a perovskite light absorbing layer of the laminate including a hole transport layer and the perovskite light absorbing layer with a coating agent for forming an electron transport layer (Step 1); forming a passivation layer on the electron transport layer through a deposition process (Step 2); and forming a source electrode on the passivation layer (Step 3).

The hole transport layer (HTL) may include an inorganic and/or organic hole transport material. The inorganic hole transport material may include one or more selected from nickel oxide ($NiO^x$), CuSCN, $CuCrO_2$, and CuI.

The organic hole transport material may include a carbazole derivative, a polyarylalkane derivative, a phenylenediamine derivative, an arylamine derivative, an amino-substituted chalcone derivative, a styrylanthracene derivative, a fluorene derivative, a hydrazone derivative, a stilbene derivative, a silazane derivative, an aromatic tertiary amine compound, a styrylamine compound, an aromatic dimethylidine-based compound, a porphyrin-based compound, a phthalocyanine-based compound, a polythiophene derivative, a polypyrrole derivative, a polyparaphenylenevinylene derivative, pentacene, coumarin 6, 3-(2-benzothiazolyl)-7-(diethylamino)coumarin), zinc phthalocyanine (ZnPC), copper phthalocyanine (CuPC), titanium oxide phthalocyanine (TiOPC), 2,2',7,7'-tetrakis(N,N-p-dimethoxyphenylamino)-9,9'-spirobifluorene (spiro-MeOTAD), copper(II) 1,2,3,4,8,9,10,11,15,16,17,18,22,23,24,25-hexadecafluoro-29H,31H-phthalocyanine (F16CuPC), boron subphthalocyanine chloride (SubPc), cis-di(thiocyanato)-bis(2,2'-bipyridyl-4,4'-dicarboxylic acid)-ruthenium(II) (N3), poly[3-hexylthiophene] (P3HT), poly[2-methoxy-5-(3',7'-dimethyloctyloxyl)]-1,4-phenylene vinylene (MDMO-PPV), poly[2-methoxy-5-(2"-ethylhexyloxy)-p-phenylene vinylene] (MEH-PPV), poly(3-octyl thiophene) (P3OT), poly(octyl thiophene) (POT), poly(3-decyl thiophene) (P3DT), poly(3-dodecyl thiophene) (P3DDT), poly(p-phenylene vinylene) (PPV), poly(9,9'-dioctylfluorene-co-N-(4-butylphenyl)diphenyl amine) (TFB), polyaniline, spiro-MeOTAD ([2,22',7,77'-tetrkis(N,N-di-pmethoxyphenyl amine)-9,9,9'-spirobifluorine]), CuSCN, CuI, poly[2,1,3-benzothiadiazole-4,7-diyl[4,4-bis(2-ethylhexyl-4H-cyclopenta[2,1-b:3,4-b'] dithiophene-2,6-diyl]] (PCPDTBT), poly[(4,4'-bis(2-ethylhexyl)dithieno[3,2-b:2',3'-d]silole)-2,6-diyl-alt-(2,1,3-benzothiadiazole)-4,7-diyl]) (Si-PCPDTBT), poly(4,8-diethylhexyloxyl) (PBDTTPD), poly[2,7-(9-(2-ethylhexyl)-9-hexyl-fluorene)-alt-5,5-(4',7,-di-2-thienyl-2',1',3'-benzothiadiazole)] (PFDTBT), poly[2,7-9,9-(dioctyl-fluorene)-alt-5,5-(4',7'-di-2-.thienyl-2',1',3'-benzothiadiazole)] (PFO-DBT), poly[(2,7-dioctylsilafluorene)-2,7-diyl-alt-(4,7-bis(2-thienyl)-2,1,3-benzothiadiazole)-5,5'-diyl] (PSiFDTBT), poly[[9-(1-octylnonyl)-9H-carbazole-2,7-diyl]-2,5-thiophenediyl-2,1,3-benzothiadiazole-4,7-diyl-2,5-thiophenediyl] (PCDTBT), poly(9,9'-dioctylfluorene-co-bis(N,N'-(4,butylphenyl))bis (N,N'-phenyl-1,4-phenylene)diamine (PFB), poly(9,9'-dioctylfluorene-cobenzothiadiazole) (F8BT), poly(3,4-ethylenedioxythiophene) (PEDOT), poly(3,4-ethylenedioxythiophene):poly(styrenesulfonate) (PEDOT:PSS), poly(triarylamine) (PTAA), 2-PACz, and/or MeO-2PACz.

In addition, as methods of forming the hole transport layer, coating and vacuum deposition may be used, and for coating, gravure coating, bar coating, printing, spraying, spin coating, dipping, and die coating may be used.

Afterwards, the light absorbing layer may include the perovskite composite material represented by Chemical Formula 1 described above.

Afterwards, the coating agent for forming an electron transport layer is a dispersion in which LiF nanoparticles are dispersed in an organic solvent, and includes 0.50 to 3.00 wt % of the LiF nanoparticles and the remainder of an organic solvent, preferably, 0.58 to 2.88 wt % of the LiF nanoparticles and the remainder of an organic solvent, and more preferably, 0.65 to 1.91 wt % of the LiF nanoparticles and the remainder of an organic solvent in the total weight.

In addition, the organic solvent may have a dielectric constant of 20 or less, and preferably, a dielectric constant of 5 to 15. As a specific example of the organic solvent, isopropyl alcohol, butyl alcohol, ethyl alcohol, and ethyl acetate may be used alone or in a combination thereof. When a solvent having a dielectric constant of more than 20 is used, the attraction between the LiF nanoparticles and a polar solvent may increase (decreased dispersibility and dispersion stability), causing the LiF nanoparticles to agglomerate, and the perovskite material, which is the light absorbing layer, may be dissolved in a polar solvent during the formation of a LiF thin film.

The coating agent for forming an electron transport layer may be used in a general solution coating method, such as spin coating, blade coating, bar coating, spray coating, gravure coating, or die coating. In one embodiment, after coating, the coated result may be heat-treated at 200° C. or less to form a super thin film with a thickness of 100 nm or less, preferably, 1 to 40 nm, and more preferably, 1 to 20 nm.

In the method of manufacturing a perovskite solar cell of the present invention, the laminate of Step 1 may be formed by forming a drain electrode on a conductive substrate, and then forming a hole transport layer, a perovskite light absorbing layer, and an electron transport layer, which have been described above, on the drain electrode sequentially.

Here, as the conductive substrate, a general conductive substrate used in the art may be used, and it may be a transparent plastic substrate made of, for example, polyethylene terephthalate, polyethylene naphthalate, polyether sulfone, aromatic polyester, or polyimide, a glass substrate, a quartz substrate, or a silicon substrate.

The drain electrode may be formed of a material including one or more selected from a conductive metal, an alloy of conductive metals, a metal oxide, and a conductive polymer. As preferable examples, these materials may include indium tin oxide (ITO), fluorine-doped tin oxide (FTO), $Sb_2O_3$-doped tin oxide (ATO), gallium-doped tin oxide (GTO), tin-doped zinc oxide (ZTO), gallium-doped ZTO (ZTO:Ga), indium gallium zinc oxide (IGZO, indium-doped zinc oxide (IZO), and/or aluminum-doped zinc oxide (AZO).

The electron transport layer formed in Step 1 is formed to have a thickness of 100 nm or less, preferably, 1 to 40 nm, and more preferably, 1 to 20 nm. Here, when the thickness of the electron transport layer exceeds 100 nm, the short-circuit current (Jsc) and open circuit voltage (Voc) of the solar cell may be reduced, and therefore the electron transport layer is preferably formed to a thickness within the above range.

The surface of the coating layer formed as described above, that is, the electron transport layer, may be formed to have a very low roughness, and the root mean square (RMS) and roughness may satisfy 25 nm or less, preferably, 17.0 to 25.0 nm, and more preferably, 17.5 to 24.0 nm.

Afterwards, in the method of manufacturing a perovskite solar cell of the present invention, Step 2 is a process of forming a passivation layer (or conductive barrier layer) on the electron transport layer through a deposition process. Here, the passivation layer may be a transparent thin film in which fullerene ($C_{60}$), LiF, bathocuproine (BCP), indium tin oxide (ITO), fluorine-doped tin oxide (FTO), $Sb_2O_3$-doped tin oxide (ATO), gallium-doped tin oxide (GTO), tin-doped zinc oxide (ZTO), gallium-doped ZTO (ZTO:Ga), indium gallium zinc oxide (IGZO), indium-doped zinc oxide (IZO), or aluminum-doped zinc oxide (AZO) is deposited.

Here, the deposition may be performed in a general deposition process used in the art, and is preferably carried out through sputtering at a process temperature of 100° C. or less under the conditions including an RF power of 100 to 300 W, a process pressure of 1 to 3 mTorr, and an argon (Ar) flow of 10 to 40 sccm.

In addition, the surface of the passivation layer may satisfy an RMS roughness of 30 nm or less, preferably, 17.5 to 27.0 nm, and more preferably, 18.0 to 25.0 nm.

In addition, the passivation layer may have a low sheet resistance of 80 W/sq or less, preferably, 76 W/sq or less, and more preferably, 30.0 to 70.0 W/sq.

The passivation layer formed in Step 2 may have an average thickness of 50 to 110 nm, preferably, 55 to 105 nm, and more preferably, 60 to 100 nm. Here, when the average thickness of the passivation layer is less than 50 nm, the thickness is so thin that an effect of preventing the penetration and ion migration into electrodes, caused by the introduction of the passivation layer, is insufficient or absent, and the sheet resistance may increase, causing a problem of reduced device performance. In addition, when the average thickness of the passivation layer exceeds 110 nm, there is an advantage in operating a device because the charge migration becomes smoother due to the decrease in sheet resistance, but damage to the light absorbing layer may occur with an increase in processing time, and productivity may decrease. In the case of a tandem device, since the light receiving direction reaches the perovskite light activating layer via the passivation layer, unnecessary photocurrent loss may occur due to the thick passivation layer, so it is preferable that the passivation layer be formed by performing deposition to have an average thickness within the above range.

Bathocuproine (BCP), which has a large energy bandgap and a very low HOMO energy level, is a compound inserted between a C60 electron acceptor layer and an electrode to suppress the phenomenon in which excitons recombine with the electrode and are extinguished. In addition, for forming the BCP passivation layer, coating and vacuum deposition may be used, and as the coating, spin coating may be used.

Afterwards, Step 3 is a process of forming a source electrode on the conductive barrier layer (passivation layer) formed in Step 2, in which the source electrode may be formed by coating or depositing one or more materials selected from Pt, Au, Ni, Cu, Ag, In, Ru, Pd, Rh, Ir, Os, C, and a conductive polymer.

In addition, among the solar cell components, the source electrode may be formed by coating or depositing one or more materials selected from Pt, Au, Ni, Cu, Ag, In, Ru, Pd, Rh, Ir, Os, C, and a conductive polymer.

Hereinafter, the present invention will be described more specifically with reference to examples, but the following examples do not limit the scope of the present invention, and should be interpreted as helping to understand the present invention.

EXAMPLES

Example 1: Synthesis of CsBr

An aqueous $Cs_2CO_3$ solution including 50 wt % of $Cs_2CO_3$ and the remainder of water was prepared. Separately, an aqueous HBr solution including 48 wt % of hydrogen bromide (HBr) and the remainder of water was prepared.

After putting the aqueous $Cs_2CO_3$ solution into a reactor, the aqueous HBr solution was added dropwise while stirring at 800 rpm and 35° C., and after the dropwise addition was completed, the reaction was performed for 1 hour while stirring was maintained, thereby preparing a reaction solution containing the reaction product CsBr (aq).

Here, the aqueous HBr solution was added dropwise so that the volume ratio of the aqueous $Cs_2CO_3$ solution and the aqueous HX solution was 1:0.87.

Next, after the reaction was completed, the aqueous HBr solution was added to a washing solvent, acetone (5 to 6° C.), with a volume ratio 10 times that of the reaction solution, and when the reaction solution was added dropwise to the washing solvent under the condition where the temperature was maintained at 5 to 6° C., the moment the reaction solution was mixed with the washing solvent, the solubility constant changed rapidly, resulting in CsBr precipitation. Here, the acetone had a polarity of 5.1, a dipole moment of 2.72, and a dielectric constant of 20.7.

Afterwards, the solution from which CsBr was precipitated was filtered using a filtering device such as a filter paper and a funnel, and the filtering residue was dried for 24 hours in a 40° C. vacuum oven to obtain a CsBr powder.

The yield of the obtained CsBr powder was 98.4%, and the purity thereof was 99.9%.

Examples 2 to 6 and Comparative Examples 1 to 4

CsBr powders were prepared in the same manner as in Example 1, except that, as shown in Table 1 below, Examples 2 to 6 and Comparative Examples 1 to 4 were performed using methanol, ethyl alcohol, methyl ethyl ketone (MEK), methyl isobutyl ketone (MIBK), acetonitrile, hexane, ether, toluene, and benzene as a washing solvent instead of acetone. The yields and purity of the obtained CsBr powders are shown in Table 2 below.

TABLE 1

| Classification | Washing solvent | Polarity | Dipole moment | Dielectric constant |
|---|---|---|---|---|
| Example 1 | Acetone | 5.1 | 2.72 | 20.7 |
| Example 2 | Methanol | 5.1 | 1.69 | 24 |
| Example 3 | Ethyl alcohol | 5.2 | 1.66 | 25.3 |
| Example 4 | MEK | 4.7 | 2.76 | 18.9 |
| Example 5 | MIBK | 4.2 | 2.80 | 13.1 |
| Example 6 | Acetonitrile | 5.8 | 3.92 | 37 |
| Comparative Example 1 | Hexane | 0.1 | 0.08 | 1.9 |
| Comparative Example 2 | Ether | 0.1 | 1.15 | 4.3 |
| Comparative Example 3 | Toluene | 2.4 | 0.36 | 2.3 |
| Comparative Example 4 | Benzene | 2.7 | 0.00 | 2.4 |

TABLE 2

| Classification | Washing solvent | Yield (%)/ Purity (%) |
|---|---|---|
| Example 1 | Acetone | 98.4/99.9 |
| Example 2 | Methanol | 87.2/99.2 |
| Example 3 | Ethyl alcohol | 86.5/99.2 |
| Example 4 | MEK | 85.1/99.0 |
| Example 5 | MIBK | 84.2/98.6 |
| Example 6 | Acetonitrile | 83.0/98.0 |
| Comparative Example 1 | Hexene | 71.4/83.2 |
| Comparative Example 2 | Ether | 68.5/83.0 |

TABLE 2-continued

| Classification | Washing solvent | Yield (%)/ Purity (%) |
|---|---|---|
| Comparative Example 3 | Toluene | 70.2/81.3 |
| Comparative Example 4 | Benzene | 62.1/78.4 |

Preparation Example 1: Preparation of Perovskite Composite Material

A precursor solution was prepared by dissolving CsBr and $PbBr_2$, which were prepared in Example 1, in dimethyl sulfoxide (DMSO).

Next, hydrobromic acid was added dropwise to the precursor solution, thereby forming an orange precipitate.

The filtrate was removed and separated using a centrifuge, and the precipitate ($CsPbBr_3$) was purified by washing it with ethanol.

Subsequently, a $CsPbBr_3$ perovskite composite material was prepared by drying the purified $CsPbBr_3$ in a vacuum oven for 24 hours.

Comparative Preparation Example 1

A $CsPbBr_3$ perovskite composite material was prepared in the same manner as in Preparation Example 1, except that commercially available CsBr (TCI product) was used instead of the CsBr prepared in Example 1. Here, the CsBr (TCI product) was prepared by a conventional method of removing impurities through a high-temperature heating process.

Preparation Examples 2 to 6 and Comparative Preparation Examples 2 to 5

$CsPbBr_3$ perovskite composite materials were prepared in the same manner as in Preparation Example 1, except that CsBrs prepared in Examples 2 to 6 and Comparative Examples 1 to 4 were used instead of the CsBr prepared in Example 1 (see Table 3).

TABLE 3

| Classification | CsBr precursor |
|---|---|
| Preparation Example 1 | Example 1 |
| Preparation Example 2 | Example 2 |
| Preparation Example 3 | Example 3 |
| Preparation Example 4 | Example 4 |
| Preparation Example 5 | Example 5 |
| Preparation Example 6 | Example 6 |
| Comparative Preparation Example 1 | CsBr (TCI product) |
| Comparative Preparation Example 2 | Comparative Example 1 |
| Comparative Preparation Example 3 | Comparative Example 2 |
| Comparative Preparation Example 4 | Comparative Example 3 |
| Comparative Preparation Example 5 | Comparative Example 4 |

Preparation Example 7: Manufacture of Perovskite Solar Cell

As a drain electrode (source electrode), an organic substrate (thickness: 1.1 mm, 15.0 Ω/sq) coated with indium tin oxide (ITO) to a thickness of approximately 110 nm was washed sequentially with acetone and isopropyl alcohol (IPA) every hour using a sonicator.

Subsequently, a 30 nm-thick hole transport layer ($NiO_x$) was formed on the ITO substrate under conditions for E-beam vacuum deposition.

Subsequently, the hole transport layer ($NiO_x$) was spin-coated with a solution in which 2PACz was dissolved in ethanol at a concentration of 2 mM, and thermally treated at 100° C. for 10 minutes, thereby forming a 2PACz hole transport layer to a thickness of 15 to 20 nm.

Subsequently, a yellow light absorbing layer solution prepared by dissolving $CsPbBr_3$ perovskite of Preparation Example 1, commercial FAI, and commercial $PbI_2$ in dimethylformamide (DMF) and dimethyl sulfoxide (DMSO) was spin-coated on the hole transport layer, and thermally treated at 100° C. for 20 minutes, thereby forming a $NiO_x$ hole transport layer and a light absorbing layer ($(FAPbI_3)_{0.8}(CsPbBr_3)_{0.2}$) having a perovskite crystal structure with a thickness of 450 to 500 nm.

Afterwards, an electron transport layer (LiF) with a thickness of 0.8 nm was formed on the perovskite light absorbing layer under thermal evaporation conditions.

Afterwards, a passivation layer ($C_{60}$ fullerene) with a thickness of 13 nm was formed on the electron transport layer under thermal evaporation conditions.

Afterwards, a BCP electron transport layer with a thickness of 5 to 10 nm was formed on the passivation layer by spin-coating a solution prepared by dissolving BCP in ethanol.

Afterwards, an inverted perovskite solar cell was manufactured by forming a source electrode by depositing silver on the BCP layer to a thickness of 150 nm under a pressure of $1\times10^{-8}$ torr.

Preparation Examples 8 to 12 and Comparative Preparation Examples 6 to 10

Inverted perovskite solar cells were manufactured in the same manner as in Preparation Example 1, except that the perovskites of Preparation Examples 2 to 6 and Comparative Preparation Examples 1 to 5 were used instead of the perovskite of Preparation Example 1 (see Table 4).

TABLE 4

| Solar cell | Perovskite | CsBr precursor |
|---|---|---|
| Preparation Example 7 | Preparation Example 1 | Example 1 |
| Preparation Example 8 | Preparation Example 2 | Example 2 |
| Preparation Example 9 | Preparation Example 3 | Example 3 |
| Preparation Example 10 | Preparation Example 4 | Example 4 |
| Preparation Example 11 | Preparation Example 5 | Example 5 |
| Preparation Example 12 | Preparation Example 6 | Example 6 |
| Comparative Preparation Example 6 | Comparative Preparation Example 1 | CsBr (TCI product) |
| Comparative Preparation Example 7 | Comparative Preparation Example 2 | Comparative Example 1 |
| Comparative Preparation Example 8 | Comparative Preparation Example 3 | Comparative Example 2 |
| Comparative Preparation Example 9 | Comparative Preparation Example 4 | Comparative Example 3 |
| Comparative Preparation Example 10 | Comparative Preparation Example 5 | Comparative Example 4 |

Experimental Example 1: Measurement of Solar Cell Performance

The current-voltage characteristics and efficiency of the solar cells manufactured in Preparation Example 1 were measured, and the results are shown in Table 5 below. In addition, the results of measuring the photoelectric conversion efficiency (PCE, %) for Preparation Example 7 and Comparative Preparation Example 6 are shown in the FIGURE.

TABLE 5

| Classification | Open circuit voltage ($V_{oc}$, V) | Short circuit current density ($J_{sc}$, mA/cm$^2$) | Fill factor (FF) | Photoelectric conversion efficiency (%) |
|---|---|---|---|---|
| Preparation Example 7 | 1.148 | 21.31 | 75.96 | 18.59 |
| Preparation Example 8 | 1.145 | 21.24 | 75.87 | 18.50 |
| Preparation Example 9 | 1.144 | 21.21 | 75.84 | 18.49 |
| Preparation Example 10 | 1.140 | 21.13 | 75.53 | 18.22 |
| Preparation Example 11 | 1.139 | 21.04 | 75.47 | 18.11 |
| Preparation Example 12 | 1.138 | 20.93 | 75.39 | 17.97 |
| Comparative Preparation Example 6 | 1.137 | 20.87 | 75.36 | 17.89 |
| Comparative Preparation Example 7 | 1.089 | 19.25 | 74.43 | 17.35 |
| Comparative Preparation Example 8 | 1.072 | 19.07 | 74.04 | 17.32 |
| Comparative Preparation Example 9 | 1.024 | 18.82 | 73.18 | 16.24 |
| Comparative Preparation Example 10 | 0.989 | 17.79 | 71.27 | 15.76 |

From the photoelectric conversion efficiency of Table 5 and the FIGURE, it was confirmed that the solar cells using the perovskites prepared using CsBr prepared by the preparation method of the present invention (Preparation Examples 7 to 12) as the material for the light absorbing layer exhibit relatively higher photoelectric conversion efficiency than that using the perovskite prepared from commercial CsBr (Comparative Preparation Example 6). In contrast, the solar cells of Comparative Preparation Examples 7 to 10 showed lower solar cell performance than that of Comparative Preparation Example 6.

According to Examples and Experimental Examples, it was able to be confirmed that the CsX production method of the present invention can be used to prepare a high-yield and high-purity CsX, and that the purity of the device used in the production of a perovskite (light activating layer) is a major factor affecting the performance of a solar cell.

The invention claimed is:

1. A method of producing a cesium halide, comprising following operations:

(i) preparing an aqueous $Cs_2CO_3$ solution;

(ii) adding an aqueous hydrogen halide (HX) solution dropwise to the aqueous $Cs_2CO_3$ solution while stirring to allow a reaction;

(iii) preparing a mixed solution by inputting and washing a reaction solution obtained in operation (ii) in a washing solvent; and (iv) obtaining a CsX powder by filtering and drying the mixed solution of operation (iii), wherein the cesium halide is CsX, and X is Cl, Br, or I, and wherein the washing solvent of operation (iii) has a polarity of 4 to 6, a dipole moment of 1.60 to 4.00 debye (D), and a dielectric constant of 13 to 37.

2. The method of claim 1, wherein the aqueous $Cs_2CO_3$ solution of operation (i) comprises 40 to 50 wt % of $Cs_2CO_3$ and a remainder of water.

3. The method of claim 1, wherein the aqueous HX solution of operation (ii) comprises 46 to 50 wt % of HX and a remainder of water, and wherein the dropwise addition of operation (ii) is carried out such that the aqueous $Cs_2CO_3$ solution and the aqueous HX solution are mixed in a volume ratio of 1:0.87 to 1.

4. The method of claim 1, wherein the mixed solution of operation (iii) comprises the reaction solution and the washing solvent in a volume ratio of 1:5 or more.

5. The method of claim 1, wherein the CsX powder obtained in operation (iv) has a yield of 83 to 99% and a purity of 97 to 99.9%.

* * * * *